US008519320B2

(12) United States Patent
Miyazawa et al.

(10) Patent No.: US 8,519,320 B2
(45) Date of Patent: Aug. 27, 2013

(54) OPTICAL SENSOR CIRCUIT OR ARRAY INCLUDING OPTICAL SENSOR ELEMENT HAVING A LIGHT DEPENDENT VARIABLE RESISTANCE ELEMENT

(75) Inventors: Toshio Miyazawa, Chiba (JP); Hideki Nakagawa, Chiba (JP); Kozo Yasuda, Mobara (JP)

(73) Assignees: Hitachi Displays, Ltd., Chiba (JP); Panasonic Liquid Crystal Display Co., Ltd., Hyogo-Ken (JP)

( * ) Notice: Subject to any disclaimer, the term of this patent is extended or adjusted under 35 U.S.C. 154(b) by 411 days.

(21) Appl. No.: 12/832,230

(22) Filed: Jul. 8, 2010

(65) Prior Publication Data
US 2011/0006192 A1 Jan. 13, 2011

(30) Foreign Application Priority Data
Jul. 9, 2009 (JP) .................................. 2009-162612

(51) Int. Cl.
*H01L 31/00* (2006.01)
(52) U.S. Cl.
USPC ..................... 250/214.1; 250/208.2; 257/431; 348/304; 348/308

(58) Field of Classification Search
USPC ................. 250/208.1, 214.1, 214 R, 214 DC, 250/208.2; 257/359, E27.1, E29.117, E29.137, 257/E29.147, E29.182, E29.202, E29.273, 257/53, 54, 72, 449, 430, 292, 291, 431, 257/293; 348/304, 308
See application file for complete search history.

(56) References Cited

U.S. PATENT DOCUMENTS
6,075,256 A * 6/2000 Kaifu et al. ..................... 257/53

FOREIGN PATENT DOCUMENTS
JP 2008-251609 10/2008

* cited by examiner

*Primary Examiner* — Francis M Legasse, Jr.
(74) *Attorney, Agent, or Firm* — Antonelli, Terry, Stout & Kraus, LLP.

(57) ABSTRACT

Each optical sensor element includes an upper electrode, a lower electrode, and a light dependent variable resistance element formed of amorphous silicon. Each optical sensor pixel includes: a capacitive element between the lower electrode and a reference voltage line; a first transistor inputting a first power source voltage to a second electrode, connecting a first electrode to the lower electrode, and inputting a second clock to a control electrode; a second transistor inputting a second power source voltage to a second electrode, and connecting a control electrode to the lower electrode; and a third transistor connecting a second electrode to a first electrode of the second transistor, connecting a first electrode to the output line, and inputting a first clock to a control electrode.

18 Claims, 13 Drawing Sheets

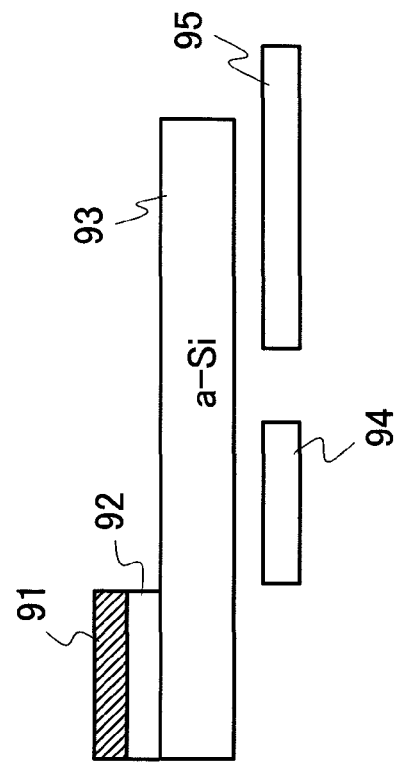
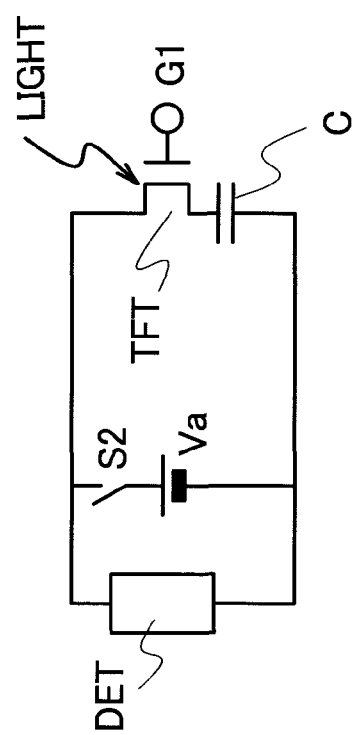
FIG. 12A PRIOR ART
FIG. 12B PRIOR ART

OPTICAL SENSOR CIRCUIT OR ARRAY INCLUDING OPTICAL SENSOR ELEMENT HAVING A LIGHT DEPENDENT VARIABLE RESISTANCE ELEMENT

CROSS-REFERENCE TO RELATED APPLICATION

The present application claims priority from Japanese application JP 2009-162612 filed on Jul. 9, 2009, the content of which is hereby incorporated by reference into this application.

BACKGROUND OF THE INVENTION

1. Field of the Invention

The present invention relates to an optical sensor array, and more particularly to an optical sensor array which uses a thick amorphous silicon film which constitutes a light dependent variable resistance element as an optical sensor element.

2. Description of the Related Art

As an optical sensor which has been used popularly, there has been known an optical sensor which adopts a method where a reverse bias is applied to crystalline silicon (Si) or a so-called pn junction of a semiconductor thus using a depletion layer as a junction capacitance, and a pair of electron and hole which are subjected to photoelectric conversion is separated, and a charge is held or taken out through the depletion layer (JP 2008-251609 A (patent document 1)). This optical sensor is schematically shown in FIG. 11A to FIG. 11D.

FIG. 11A shows an equivalent circuit in a simplified manner. In FIG. 11A, symbol PD indicates a photo diode, symbols S1, S2 indicate switches, symbol DET indicates a detection mechanism, and symbol Va indicates a power source.

Here, the photo diode PD is a depletion layer capacitance part where a reverse bias is applied to the pn junction, wherein a photoelectric charge pair which is generated in a semiconductor layer by an incident light is separated and a charge is stored as an effective charge. The stored photo charge is read by a switch S1 at certain timing, and is detected as a quantity of charge dependent on a light quantity by the detection mechanism DET. When the reading of the stored photo charge is finished, a predetermined reverse bias is applied to the photo diode PD from the power source Va by operations of switches S1, S2 so that initial setting is performed whereby the photo charge is stored in the photo diode PD again.

FIG. 11B, FIG. 11C and FIG. 11D show constitutional examples of the pn junction which constitutes the photo diode PD, wherein FIG. 11B shows the constitutional example where a depletion layer capacitance is generated longitudinally, FIG. 11C shows the constitutional example where a depletion layer capacitance is generated laterally, and FIG. 11D shows a constitutional example which is referred to as PIN. Here, as has been well-known, in FIG. 11B, FIG. 11C and FIG. 11D, symbol p indicates a p-type region, symbol n indicates an n-type region, and symbol I indicates an insulation layer.

SUMMARY OF THE INVENTION

In a method for manufacturing a photo diode PD shown in FIG. 11 in a thin film transistor, it is possible to form the circuit constitution shown in FIG. 11C using low-temperature polysilicon (p-Si) which is one of polycrystalline silicon, for example.

To acquire sufficient sensitivity for infrared rays, a semiconductor which has a large thickness in the advancing direction of light is necessary. However, currently available low-temperature polysilicon (p-Si) is formed by stacking amorphous silicon on a substrate and, thereafter, by melting amorphous silicon using a laser such as an ELA (excimer laser) for crystallizing amorphous silicon. In view of the correlation with energy of the ELA or the like, it is difficult to increase the thickness of the semiconductor.

There has been also known a method which makes use of a thin film transistor which uses amorphous silicon (a-Si) as a material of the semiconductor layer as an optical sensor, different from crystalline silicon (Si) or low-temperature polysilicon (p-Si), it is difficult for amorphous silicon (a-Si) to form a pn junction and hence, it is necessary to take countermeasures to cope with the situation.

FIG. 12A and FIG. 12B show one example, wherein FIG. 12A shows an example of an equivalent circuit in a simplified manner. In FIG. 12A, symbol TFT indicates a thin film transistor which uses amorphous silicon as a material of a semiconductor layer, symbol S2 indicates a switch, symbol DET indicates a detection mechanism, symbol C indicates a capacitive element, symbol Va indicates a power source, and symbol G1 indicates a gate pulse. This example is a method which makes use of a channel and a source of the thin film transistor TFT as a photo sensor and a light charge storage (holding) part respectively.

FIG. 12B shows a structural example of the thin film transistor. In FIG. 12B, symbol 91 indicates a metal electrode, symbol 92 indicates an $n^+$ a-Si, symbol 93 indicates a-Si, symbol 94 indicates a gate, and symbol 95 indicates a capacitor forming electrode.

In the method shown in FIG. 12A and FIG. 12B, a fixed voltage is held in the source and the thin film transistor TFT is held in an OFF state by setting the gate 94 at a Low level. When light is incident on the channel, the resistance of amorphous silicon (a-Si) is lowered so that a leak current is increased for the gate voltage in the same manner as when light is not incident on the channel. Accordingly, a charge stored in the source is discharged to a drain side.

By making use of a phenomenon that a charge quantity necessary for recharging of a source voltage differs depending on incidence intensity of light after a lapse of a fixed time, a charge quantity necessary for recharging the source voltage is detected by the detection mechanism DET thus using the thin film transistor as an optical sensor. Since the method makes use of a leak current with the gate in an OFF state, the method has a drawback that irregularities of a dark current are large.

As a method which suppresses the drawback which arises when the thin film transistor TFT which uses amorphous silicon (a-Si) as the material of the semiconductor layer is used as the optical sensor, that is, irregularities attributed to the leak current with the gate in an OFF state, there has been known a method which makes use of an insulation film as a capacitive element as shown in FIG. 13A and FIG. 13B.

FIG. 13A shows one example of an equivalent circuit. In FIG. 13A, symbol PDP indicates a light receiving part, symbols S1, S2 indicate switches, symbol DET indicates a detection mechanism, symbol C indicates a capacitive element, and symbols Va, Vb indicate power sources.

FIG. 13B shows a constitutional example of the light receiving part PDP. In FIG. 13B, symbol 96 indicates an upper electrode, symbol 97 indicates a light dependent variable resistance element (amorphous silicon (a-Si)), symbol 98 indicates an insulation film, and symbol 99 indicates a lower electrode.

In the method shown in FIG. 13A and FIG. 13B, firstly, the lower electrode 99 is charged by using the switch S1 and the switch S2 and the voltage difference is formed between the lower electrode 99 and the upper electrode 96 and, thereafter, the switch S1 and the switch S2 are cut thus bringing the lower electrode 99 into a floating state.

The light dependent variable resistance element (amorphous silicon (a-Si)) which is arranged between the upper electrode 96 and the insulation film 98 which constitutes a capacitive element C changes a resistance value in response to an incident light quantity, discharges a charge of the capacitive element C, and changes the potential difference.

The circuit detects the difference in charge quantity necessary for recharging of the lower electrode 99 by the detection mechanism DET and hence, the circuit is used as an optical sensor.

To increase sensitivity of light having a long wavelength such as infrared rays, it is necessary to use amorphous silicon (a-Si) having a large thickness in the advancing direction of light.

When polysilicon (p-Si) is used, as shown in FIG. 11D, there has been known a method which stacks amorphous silicon (a-Si) having a large thickness on polysilicon (p-Si).

The method shown in FIG. 12A and FIG. 12B is classified into a method which increases a film thickness of amorphous silicon (a-Si) or a method which further stacks amorphous silicon (a-Si) on a source side in the same manner as the method shown in FIG. 11D. In case of the method shown in FIG. 13A and FIG. 13B, it is enough to increase a thickness of amorphous silicon (a-Si).

However, both methods have a drawback that a dynamic range of a detection voltage is narrow.

The present invention has been made to overcome the drawbacks of the related art, and it is an object of the present invention to provide a technique which can widen a dynamic range of a detection voltage compared to the related art in an optical sensor circuit and an optical sensor array.

The above-mentioned object and other objects and novel technical features of the present invention will become apparent from the description of this specification and attached drawings.

To briefly explain the summary of typical inventions among inventions described in this specification, they are as follows.

(1) According to one aspect of the present invention, there is provided an optical sensor circuit which includes: an optical sensor element having an upper electrode to which a first reference voltage is inputted, a lower electrode which is formed of a metal film, and a light dependent variable resistance element which is sandwiched between the upper electrode and the lower electrode: a capacitive element which is connected between the lower electrode and a second reference voltage line which supplies a second reference voltage; a switch circuit which inputs a first power source voltage to the lower electrode in an ON state, and brings the lower electrode into a floating state in an OFF state; and a detection circuit which detects a voltage change of the lower electrode after light is radiated to the light dependent variable resistance element for a predetermined period with the lower electrode in a floating state, wherein the light dependent variable resistance element is formed of an amorphous silicon film, and the first reference voltage is a forward voltage in a current-voltage characteristic of a diode which is constituted of the lower electrode and the amorphous silicon film which constitutes the light dependent variable resistance element.

(2) According to another aspect of the present invention, there is provided an optical sensor circuit which includes a first optical sensor element having a first upper electrode to which a first reference voltage is inputted, a first lower electrode which is formed of a metal film, and a first light dependent variable resistance element which is sandwiched between the first upper electrode and the first lower electrode: a second optical sensor element for dark current compensation having a second upper electrode to which the first reference voltage is inputted, a second lower electrode, and a second light dependent variable resistance element which is sandwiched between the second upper electrode and the second lower electrode: a capacitive element which is connected between the first lower electrode and the second lower electrode; a first switch circuit which inputs a first power source voltage to the first lower electrode in an ON state, and brings the first lower electrode into a floating state in an OFF state; a second switch circuit which inputs a first power source voltage to the second lower electrode in an ON state, and brings the second lower electrode into a floating state in an OFF state; a third switch circuit which inputs the first power source voltage to the second lower electrode after a lapse of a predetermined period in a state where the second lower electrode is in a floating state; and a detection circuit which detects a voltage change of the first lower electrode when the third switch circuit is in an ON state after light is radiated to the first light dependent variable resistance element for a predetermined period with the first lower electrode in a floating state, wherein the first light dependent variable resistance element is formed of an amorphous silicon film, the second light dependent variable resistance element is formed of an amorphous silicon film which is shielded from light, and the first reference voltage is a forward voltage in a current-voltage characteristic of a diode which is constituted of the first lower electrode and the amorphous silicon film which constitutes the first light dependent variable resistance element, and in a current-voltage characteristic of a diode which is constituted of the second lower electrode and the amorphous silicon film which constitutes the second light dependent variable resistance element.

(3) According to another aspect of the present invention, there is provided an optical sensor array which includes: optical sensor pixels arranged in a matrix array, each optical sensor pixel including an optical sensor element; and output lines, wherein each optical sensor element includes an upper electrode to which a first reference voltage is inputted, a lower electrode, and a light dependent variable resistance element which is sandwiched between the upper electrode and the lower electrode, each optical sensor pixel includes: a capacitive element which is connected between the lower electrode and a second reference voltage line which supplies a second reference voltage; a first transistor which allows a first power source voltage to be inputted to a second electrode thereof, allows a first electrode thereof to be connected to the lower electrode, and allows a second clock to be inputted to a control electrode thereof; a second transistor which allows a second power source voltage to be inputted to a second electrode thereof, and allows a control electrode thereof to be connected to the lower electrode; and a third transistor which allows a second electrode thereof to be connected to a first electrode of the second transistor, allows a first electrode thereof to be connected to the output line, and allows a first clock to be inputted to a control electrode thereof, wherein the light dependent variable resistance element is formed of an amorphous silicon film.

(4) In the optical sensor array having the above-mentioned constitution (3), the third transistor is turned on in response to a first clock inputted prior to the second clock, the output line is set to the first reference voltage before the third transistor is turned on, and a voltage change of the lower electrode after light is radiated to the light dependent variable resistance element for a predetermined period with the lower electrode in a floating state is detected as a voltage change of the output line by the second transistor and the third transistor.

(5) According to a further aspect of the present invention, there is provided an optical sensor array which includes: optical sensor pixels arranged in a matrix array, each optical sensor pixel including a first optical sensor element and a second optical sensor element for dark current compensation; and output lines, wherein the first optical sensor element includes a first upper electrode to which a first reference voltage is inputted, a first lower electrode, and a first light dependent variable resistance element which is sandwiched between the first upper electrode and the first lower electrode, the second optical sensor element includes a second upper electrode to which a first reference voltage is inputted, a second lower electrode, and a second light dependent variable resistance element which is sandwiched between the second upper electrode and the second lower electrode, each optical sensor pixel includes: a capacitive element which is connected between the first lower electrode and a second lower electrode; a first transistor which allows a first power source voltage to be inputted to a second electrode thereof, allows a first electrode thereof to be connected to the first lower electrode, and allows a second clock to be inputted to a control electrode thereof; a second transistor which allows a second power source voltage to be inputted to a second electrode thereof, and allows a control electrode thereof to be connected to the lower electrode; a third transistor which allows a second electrode thereof to be connected to a first electrode of the second transistor, allows a first electrode thereof to be connected to the output line, and allows a first clock to be inputted to a control electrode thereof, a fourth transistor which allows a first power source voltage to be inputted to a second electrode thereof, allows a first electrode thereof to be connected to the second lower electrode, and allows a second clock to be inputted to a control electrode thereof, and a fifth transistor which allows a second power source voltage to be inputted to a second electrode thereof, allows a first electrode thereof to be connected to the second lower electrode, and allows a first clock to be inputted to a control electrode thereof, wherein the first light dependent variable resistance element is formed of an amorphous silicon film, and the second light dependent variable resistance element is formed of an amorphous silicon film which is shielded from light.

(6) In the optical sensor array having the above-mentioned constitution (5), the third transistor is turned on in response to the first clock inputted prior to the second clock, the output line is set to the first reference voltage before the third transistor is turned on, and a voltage change of the lower electrode after light is radiated to the light dependent variable resistance element for a predetermined period with the first lower electrode in a floating state is detected as a voltage change of the output line by the second transistor and the third transistor.

To briefly explain advantageous effects obtained by the representative inventions among the inventions described in this specification, they are as follows.

According to the present invention, it is possible to make a dynamic range of a detection voltage wider than a dynamic range of a detection voltage acquired by the related art.

BRIEF DESCRIPTION OF THE DRAWINGS

FIG. 12A and FIG. 12B are schematic views for explaining a conventional optical sensor circuit which adopts a thin film transistor which forms a semiconductor layer thereof using amorphous silicon.

DETAILED DESCRIPTION OF THE INVENTION

Hereinafter, embodiments of the present invention are explained in detail by reference to the drawings.

In all drawings for explaining the embodiments, parts having identical functions are given same symbols and their repeated explanation is omitted.

Embodiment 1

Figure 1A:
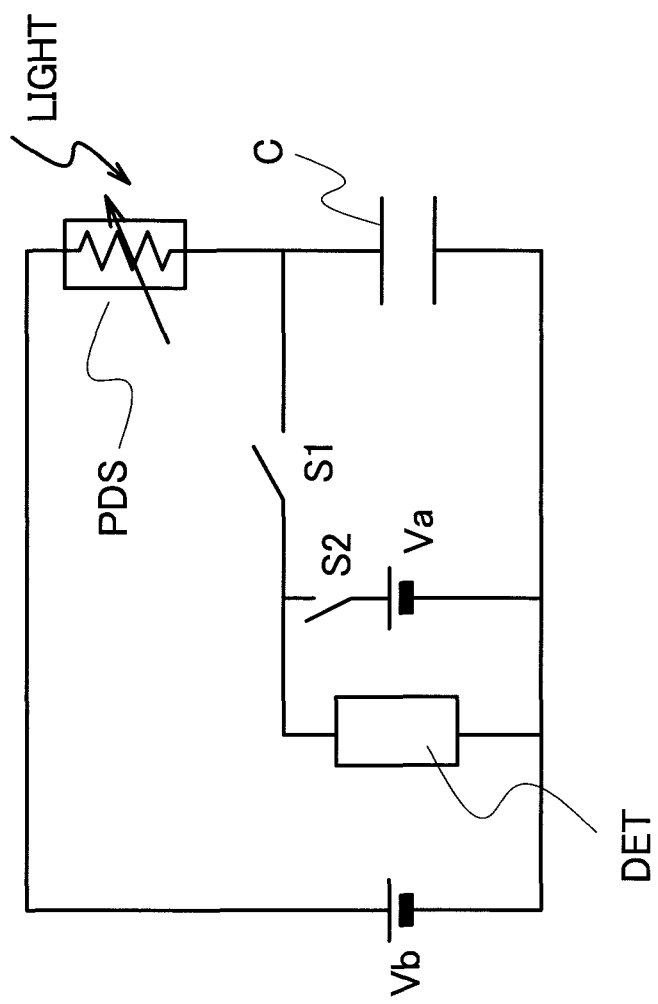
FIG. 1A and FIG. 1B are schematic views showing the overall constitution of an optical sensor circuit according to an embodiment of the present invention.
Figure 1B:
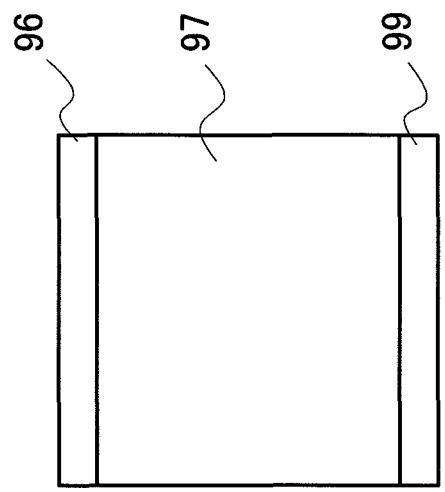

FIG. 1A and FIG. 1B are schematic views showing the overall constitution of an optical sensor circuit according to the embodiment of the present invention, wherein FIG. 1A is a view showing an equivalent circuit of the optical sensor circuit, and FIG. 1B is a view showing the constitution of an optical sensor element. In FIG. 1, symbol PDS indicates a light receiving element, symbols S1, S2 indicate switches, symbol DET indicates a detection mechanism, symbol C indicates a capacitive element, and symbols Va, Vb indicate power sources.

As shown in FIG. 1B, the optical sensor element PDS of this embodiment is constituted of an upper electrode 96, a lower electrode 99, and a light dependent variable resistance element (amorphous silicon (a-Si)) 97 which is arranged between the upper electrode 96 and the lower electrode 99. Here, a film thickness of the light dependent variable resistance element 97 (amorphous silicon (a-Si)) is preferably 500 μm or more.

As shown in FIG. 1A, in this embodiment, by turning on or off the connection between the lower electrode 99 and the power source Va in response to operations of switches S1, S2, an electric current flows against the resistance of the light dependent variable resistance element (amorphous silicon (a-Si)) 97 which is changed corresponding to an incident light so that a voltage (stored charge quantity) of the lower electrode 99 is changed. An incident light quantity can be measured by reading the voltage (stored charge quantity) via the detection mechanism DET (detection circuit).

Figure 13A:
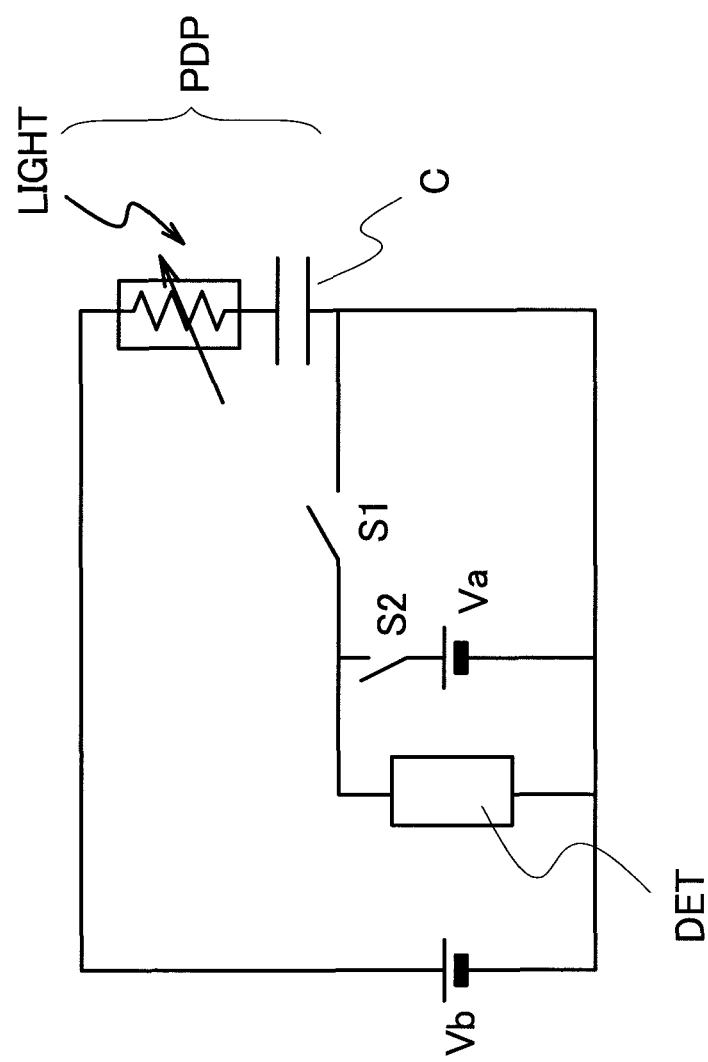
FIG. 13A and FIG. 13B are schematic views for explaining a conventional optical sensor circuit which uses a light dependent variable resistance element.
Figure 13B:
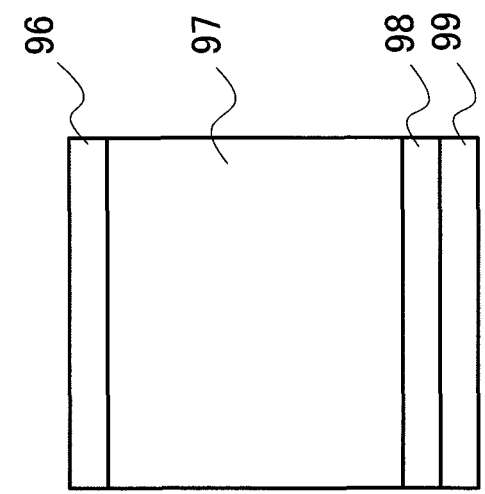

In the conventional method shown in FIG. 13A and FIG. 13B and in this embodiment, between the light dependent variable resistance element 97 and the lower electrode 99 formed of a metal layer, a Schottky diode constituted of a Schottky junction is formed.

Figure 2:
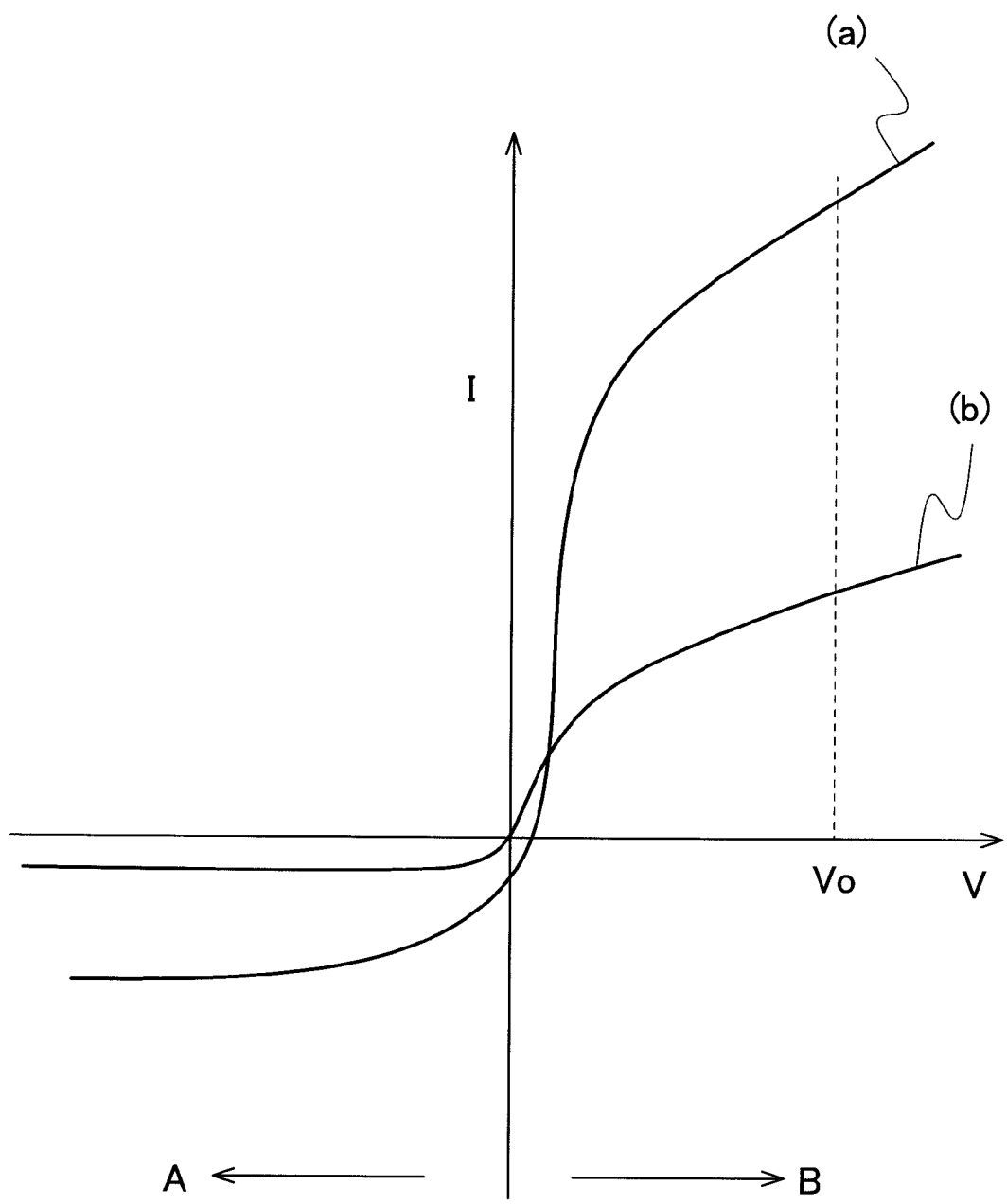
FIG. 2 is a schematic view for explaining a characteristic of a Schottky diode.

FIG. 2 is a schematic view for explaining a characteristic of the Schottky diode.

In the conventional method shown in FIG. 13A and FIG. 13B, the Schottky diode which is formed between the light dependent variable resistance element 97 and the lower electrode 99 formed of the metal layer is used in an inverse-direction bias voltage region (a region indicated by A in FIG. 2).

To the contrary, in this embodiment, the Schottky diode which is formed between the light dependent variable resistance element 97 and the lower electrode 99 formed of the metal layer is used in a forward-direction bias voltage region (a region indicated by B in FIG. 2).

In FIG. 2, a curve indicated by (a) shows a current-voltage characteristic when light (for example, infrared rays) of predetermined intensity is radiated to the Schottky diode, and a curve indicated by (b) shows a current-voltage characteristic when light (for example, infrared rays) is not radiated to the Schottky diode.

In this manner, according to this embodiment, the Schottky diode is used in the forward-direction bias voltage region and hence, when light is radiated to the light dependent variable resistance element 97, a large current flows in the circuit so that a voltage change of a detection voltage becomes large whereby a dynamic range of the detection voltage can be widened.

Figure 3:
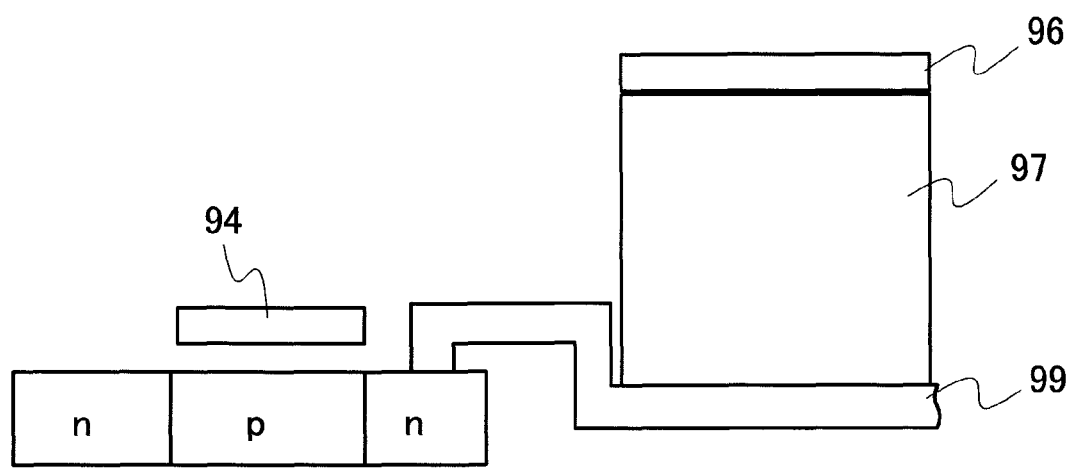
FIG. 3 is a view showing the constitution of an actual optical sensor element of the optical sensor circuit according to the embodiment of the present invention.

In the explanation made hereinafter specifically, circuit elements are also formed on a sensor substrate using polysilicon or the like and hence, the actual optical sensor element has the constitution shown in FIG. 3.

Hereinafter, the optical sensor array according to the embodiment of the present invention is explained in conjunction with FIG. 4 to FIG. 7.

Figure 4:
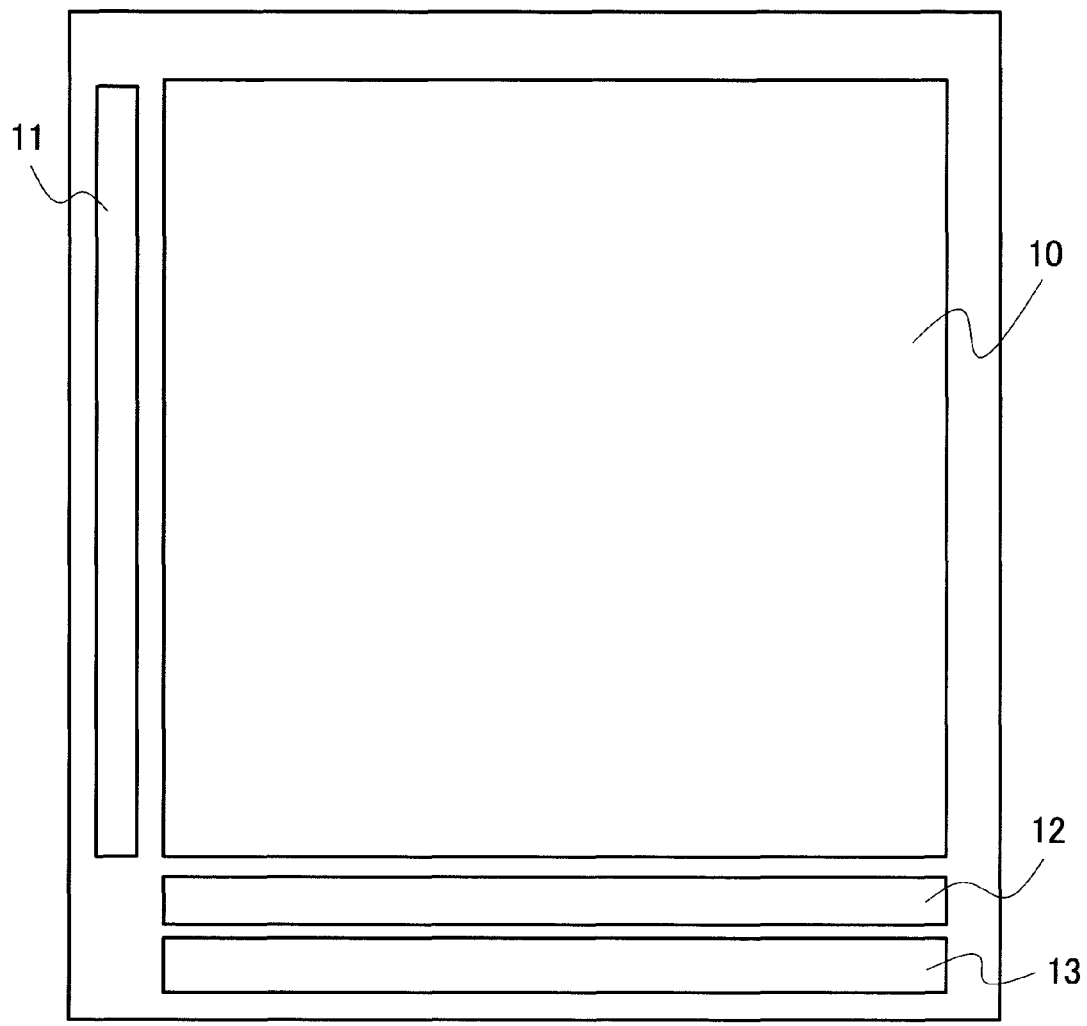
FIG. 4 is a block diagram showing the constitution of the optical sensor array according to the embodiment of the present invention.

FIG. 4 is a block diagram showing the constitution of the optical sensor array according to the embodiment of the present invention.

In the optical sensor array of this embodiment, an optical sensor pixel array part 10 is provided at a center portion, a shift register 11 which resets voltages of optical sensor pixels for reading optical sensor pixels and which sequentially supplies read pulses to rows for reading is provided at a left side on the periphery of the optical sensor pixel array part 10, and a bonding pad part 13 for connection with an external device and a reset circuit 12 which resets a signal line potential are provided at a lower peripheral side of the optical sensor pixel array part 10.

Here, the optical sensor pixel array part 10 is, for example, constituted of 15,000 (100×150) optical sensor pixels which are arranged in a matrix array.

Figure 5:
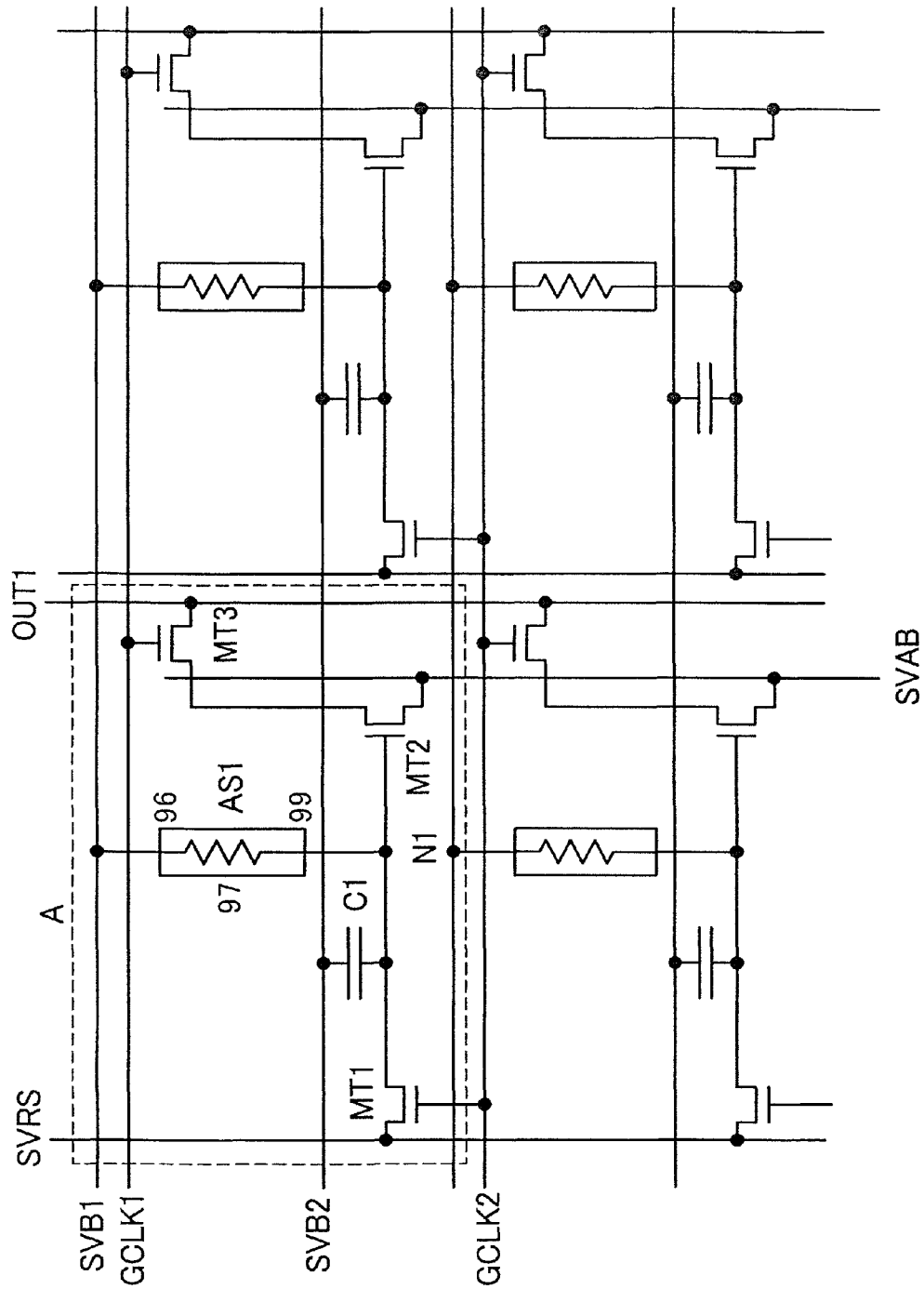
FIG. 5 is a circuit diagram of optical sensor pixels amounting to four pixels in the optical sensor array according to the embodiment of the present invention.

FIG. 5 is a circuit diagram of optical sensor pixels amounting to four pixels in the optical sensor array according to the embodiment. A portion A surrounded by a dotted line in the drawing indicates the optical sensor pixel amounting to one pixel.

The optical sensor pixel amounting to one pixel is constituted of three transistors (MT1 (first transistor; switch circuit; MT2 (second transistor), and MT3 (third transistor)), the light dependent variable resistance element AS1, a capacitive element C1, gate lines (GCLK1, GCLK2) for resetting reading, reset lines SVRS first power source voltage lines), VB1 (first reference voltage), VB2 (second reference voltage) for supplying a reset voltage VRS (first power source voltage), bias lines (SVB1 (first reference voltage line), SVB2 (second reference voltage line), SVAB (second power source voltage line)) for supplying a bias voltage (fixed voltage) VAB (second power source voltage), and a signal output line OUT1.

Here, the light dependent variable resistance element AS1 is made of amorphous silicon (a-Si).

Figure 6:
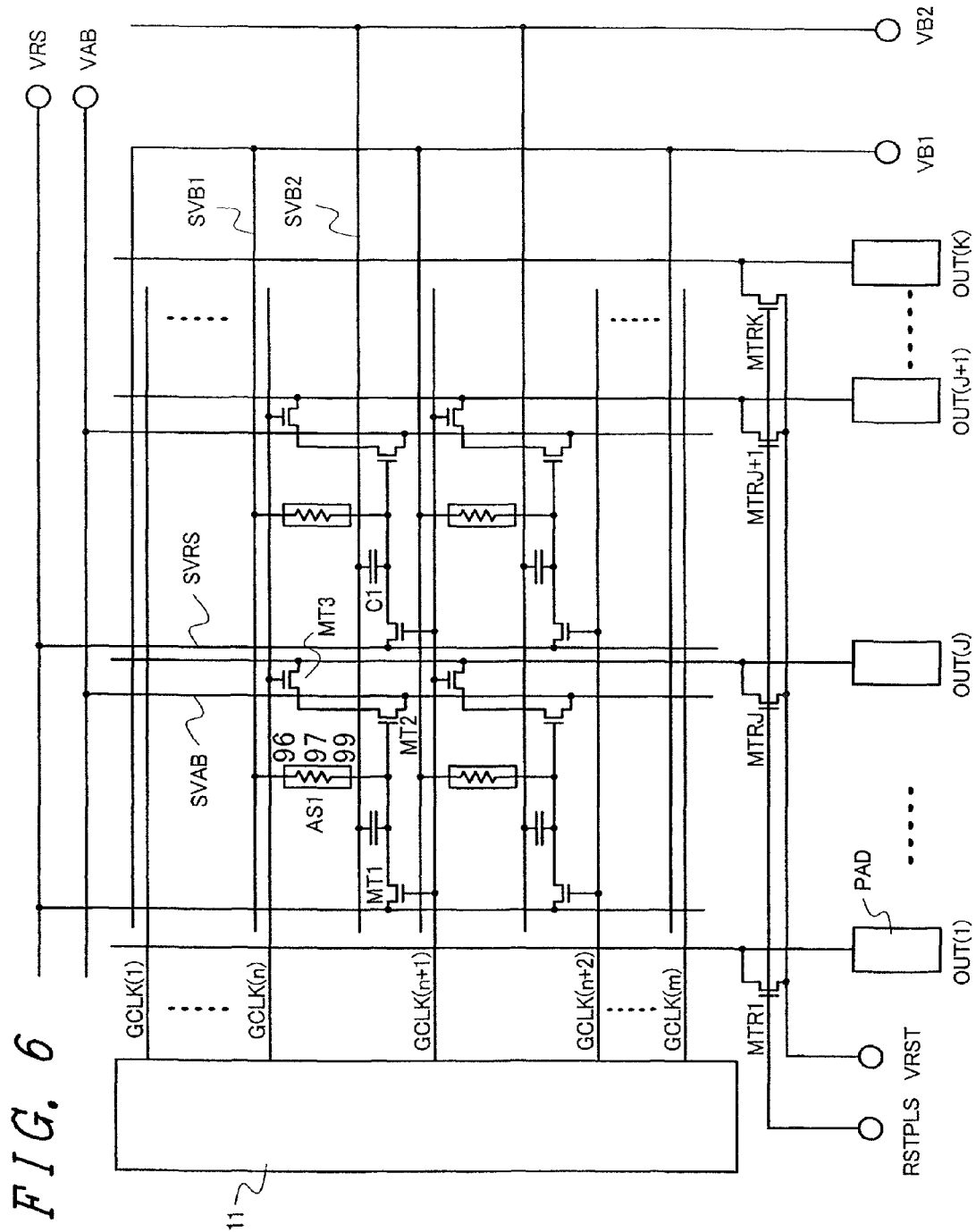
FIG. 6 is a circuit diagram showing the circuit constitution of the optical sensor array according to the embodiment of the present invention.

FIG. 6 is a circuit diagram showing the circuit constitution of the optical sensor array according to the embodiment.

The number of optical sensor pixels is m×K, and four pixels on a n-th row, an (n+1)th row, a J-th column and a (J+1)th column are shown in a specific circuit diagram. The circuit diagram of the optical sensor pixels is substantially equal to the corresponding circuit diagram shown in FIG. 5.

On a lower peripheral side of the optical sensor array, reset transistors MTR for resetting voltages of signal output lines OUT, a reset line SVRST for supplying a reset voltage VRST and bonding pads PAD for outputting are arranged.

Figure 7:
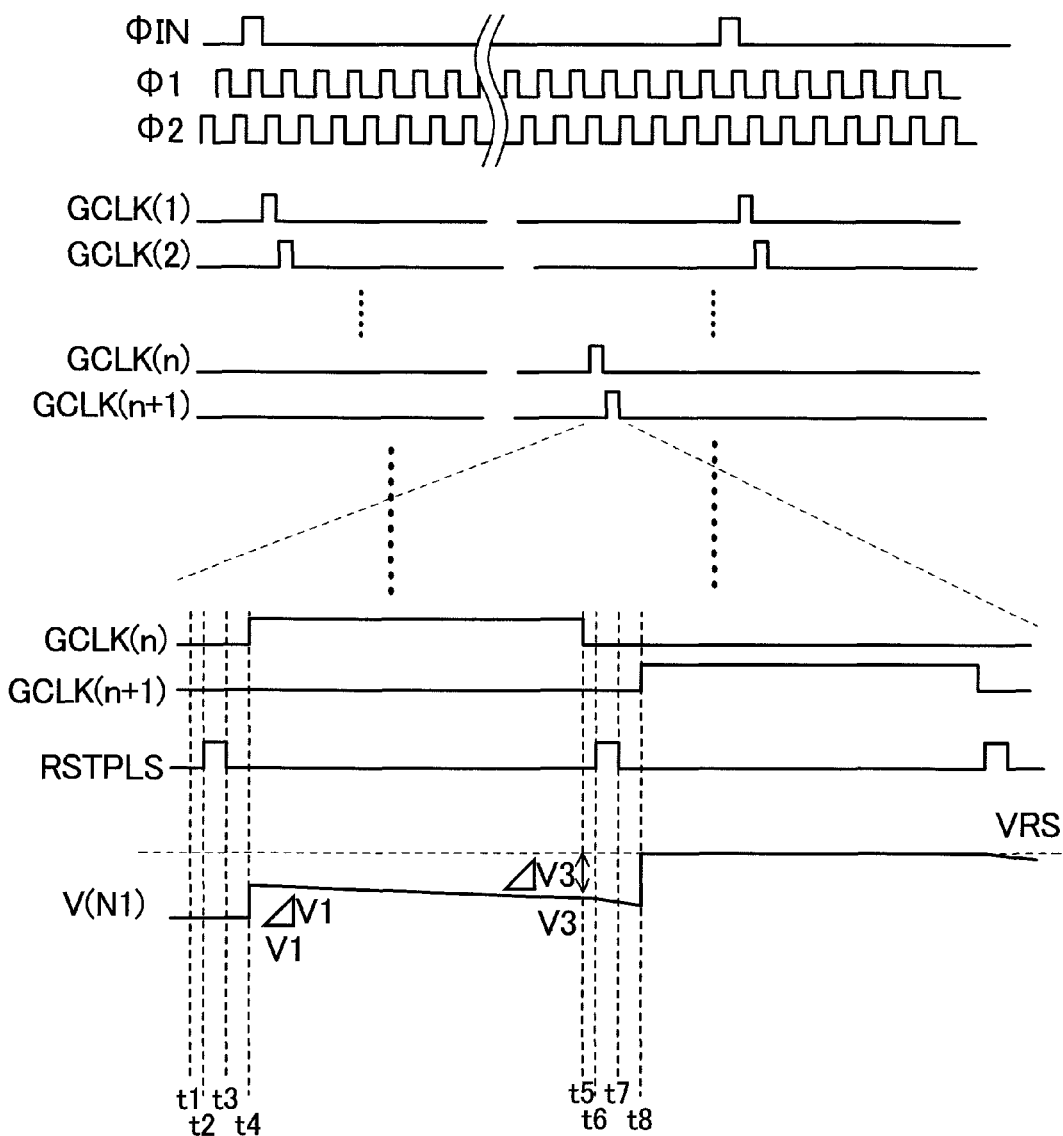
FIG. 7 is a timing chart for explaining an operation of the optical sensor array according to the embodiment of the present invention.

FIG. 7 is a timing chart for explaining an operation of the optical sensor array according to this embodiment. The manner of operation of the optical sensor pixel in the portion A shown in FIG. 5 is explained hereinafter in conjunction with FIG. 7.

For the sake of brevity, the respective bias voltages are set such that VB1=VB2=0V(GND), VAB=10V, while the reset voltages are set such that VRS=5V, VRST=0V. Further, threshold voltages Vth of the respective transistors (MT1 to MT3) are set to 1V for the sake of brevity. Further, voltages of respective clocks ($\phi$1, $\phi$2) are set such that a High level (hereinafter referred to as H level) is 10V and a Low level (hereinafter referred to as L level) is 0V. Here, voltage values of the respective bias voltages are merely one example, and may be set to voltages other than the above-mentioned values. Further, the bias voltage VAB may be a voltage equal to or higher than the reset voltage VRS.

In FIG. 6, it is assumed that the respective optical sensor pixel rows are sequentially scanned by the shift register 11 from the top to the bottom on a surface of the drawing. That is, in FIG. 6, it is assumed that an ON voltage pulse is applied to the gate lines GCLK from the small-number row to the large-number row. Further, the explanation is made hereinafter by setting the gate lines GCLK such that GCLKn=GCLK1 and GCLK(n+1)=GCLK2.

Firstly, considered is a case where a voltage of 10V at an H level (second clock) is supplied to the gate line GCLK2 by the shift register 11. In this case, in the optical sensor pixel in the portion A, the transistor MT1 assumes an ON state, an internal node N1 of the optical sensor pixel becomes electrically conductive with the reset line SVRS, and the voltage at the internal node N1 assumes the same potential 5V as the reset voltage VRS. This voltage of 5V corresponds to the voltage Vo shown in FIG. 2.

Next, when the voltage supplied to the gate line GCLK2 assumes the voltage of 0V at a L level, although the internal node N1 of the optical sensor pixel becomes an electrically isolated node, the voltage at the internal node N1 is held by a capacitive element C1 arranged between the node N1 and the bias voltage line SVB2.

In such a state, the internal node N1 is connected to a bias potential VB1 of 0V of the bias line SVB1 via the light dependent variable resistance element AS1 which is a high-resistant semiconductor. For example, it is assumed that a resistance value of the light dependent variable resistance element AS1 is a value which allows the flow of a dark current of approximately several tens fA at a room temperature.

When light (infrared rays) is radiated to the light dependent variable resistance element AS1, the resistance is lowered due to carrier pairs generated in the semiconductor by photoelectric conversion and hence, the light dependent variable resistance element AS1 functions as an optical sensor. For example, it is assumed that the light dependent variable resistance element AS1 is designed to be used for an environmental purpose where an electric current of several pA flows in the optical sensor.

A charge stored in the internal node N1 is discharged to the bias line SVB2 via the light dependent variable resistance element AS1 in this manner, and a quantity of charge to be discharged is changed corresponding to a dark state and a quantity of incident light. Accordingly, the voltage at the node N1 after a lapse of a fixed time differs corresponding to an incident light quantity.

A period during which the voltage supplied to the gate line GCLK2 by the shift register 11 assumes the voltage of 0V at an L level, scanning of gate lines by the shift register 11 completes approximately one cycle (one frame), and the voltage of 10V at an H level (first clock) is supplied to the gate line GCLK1 is a storage time of the optical signal due to the incident light.

When the control voltage RSTPLS assumes the voltage of 10V at an H level, for example, at a point of time t2, the reset transistor MTR shown in FIG. 6 assumes an ON state, and the signal output line OUT1 is reset to the reset voltage VRST.

When the control voltage RSTPLS assumes 0V at an L level at a point of time t3, the signal output line OUT1 assumes a floating state.

When the voltage of 10V at an L level is supplied to the gate line GCLK1 at a point of time t4, the transistor MT3 assumes an ON state so that the signal output line OUT1 and the bias line SVAB are connected with each other via the transistor MT2 and the transistor MT3.

Although the gate voltage of the transistor MT3 is 10V and is in a non-saturated operation, a gate of the transistor MT2 constitutes the internal node N1 so that the voltage of the gate is 5V or below corresponding to the incidence light quantity as described above and hence, the gate of the transistor MT2 is in a saturated operation.

Accordingly, the transistor MT2 is cut off in response to the source voltage (V3) corresponding to the gate voltage so that the voltage of the output line OUT1 assumes a value dependent on the voltage at the internal node N1 whereby an output voltage dependent on incident light quantity can be acquired as a result.

When the voltage of 0V at an L level is supplied to the gate line GCLK1 at a point of time t5, the transistor MT3 assumes an OFF state.

When the voltage of 10V at an H level is supplied to the gate line GCLK2 at a point of time t8, the transistor MT1 assumes an ON state so that the internal node N1 is reset to the reset voltage VRS of 5V.

The above-mentioned operations are repeated at the respective pixels.

As can be understood from FIG. 2 described above, according to the optical sensor array of this embodiment, the output signal voltage (or electric current) inevitably contains a relatively large dark current component. The dark current of the light dependent variable resistance element (amorphous silicon) which is the high resistant semiconductor has relatively large temperature dependency and hence, it is necessary to correct a dark current component in an environment where the optical scanning array is used.

The optical sensor array of this embodiment is provided upon the presumption that a dark state is created in the environment where the optical array is used, and processing which subtracts the voltage from output at the time of radiating light is performed outside. Although not explicitly described, the processing circuit can be realized in various forms.

Hereinafter, as a modification of this embodiment, the explanation is made with respect to an embodiment where a compensation element for correcting a dark current which is made of the same material as the high resistant semiconductor for optical sensor (light dependent variable resistance element (amorphous silicon)) and which is shielded from light is provided for every optical sensor pixel, and a dark current component is corrected at the time of reading a charge by a sensor.

[Modification]

Figure 8:
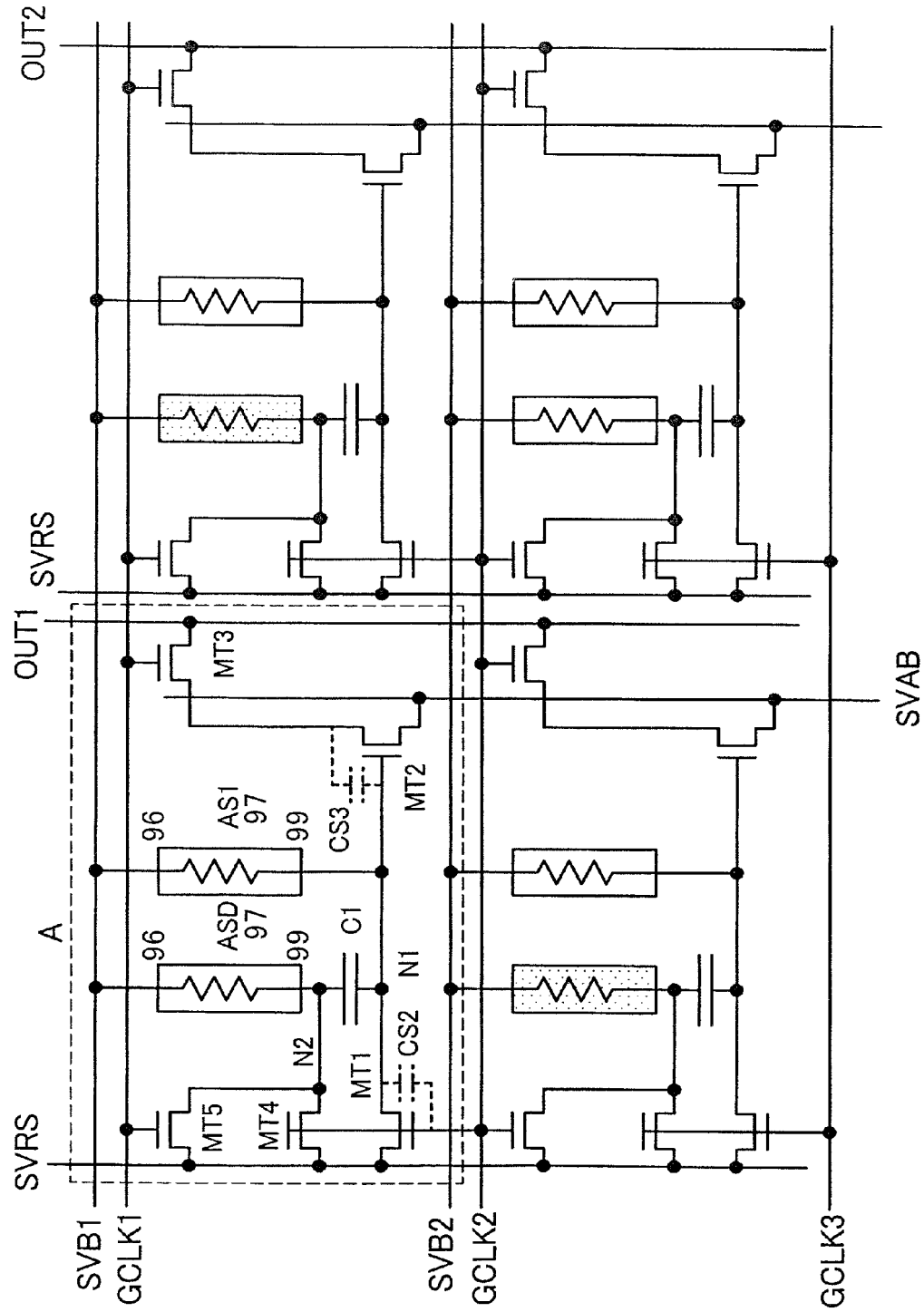
FIG. 8 is a circuit diagram of optical sensor pixels amounting to four pixels in the optical sensor array according to a modification of the embodiment of the present invention.

FIG. 8 is a circuit diagram of optical sensor pixels amounting to four pixels in the optical sensor array according to the modification of the embodiment of the present invention. In the same manner as the circuit diagram shown in FIG. 5, a portion A surrounded by the dotted line in the drawing indicates an optical sensor pixel amounting to one pixel.

The optical sensor pixel of 1 pixel is constituted of five transistors (MT1 (first transistor; first switch circuit), MT2 (second transistor), MT3 (third transistor), MT4 (fourth transistor; second switch circuit), and MT 5 (fifth transistor; third switch circuit)) a light dependent variable resistance element AS1 which constitutes an optical sensor, a light dependent variable resistance element ASD for dark current compensation which is shielded from light, a holding capacitive element C1, gate lines (GCLK1, GCLK2) for resetting reading, reset lines SVRS, VB1 for supplying a reset voltage VSR, bias lines (SVB1, SVAB) for supplying a bias voltage (fixed voltage) VAB, and a signal output line OUT1. Here, the light dependent variable resistance element AS1 and the light dependent variable resistance element ASD for dark current compensation which is shielded from light are made of amorphous silicon (a-Si).

Figure 9:
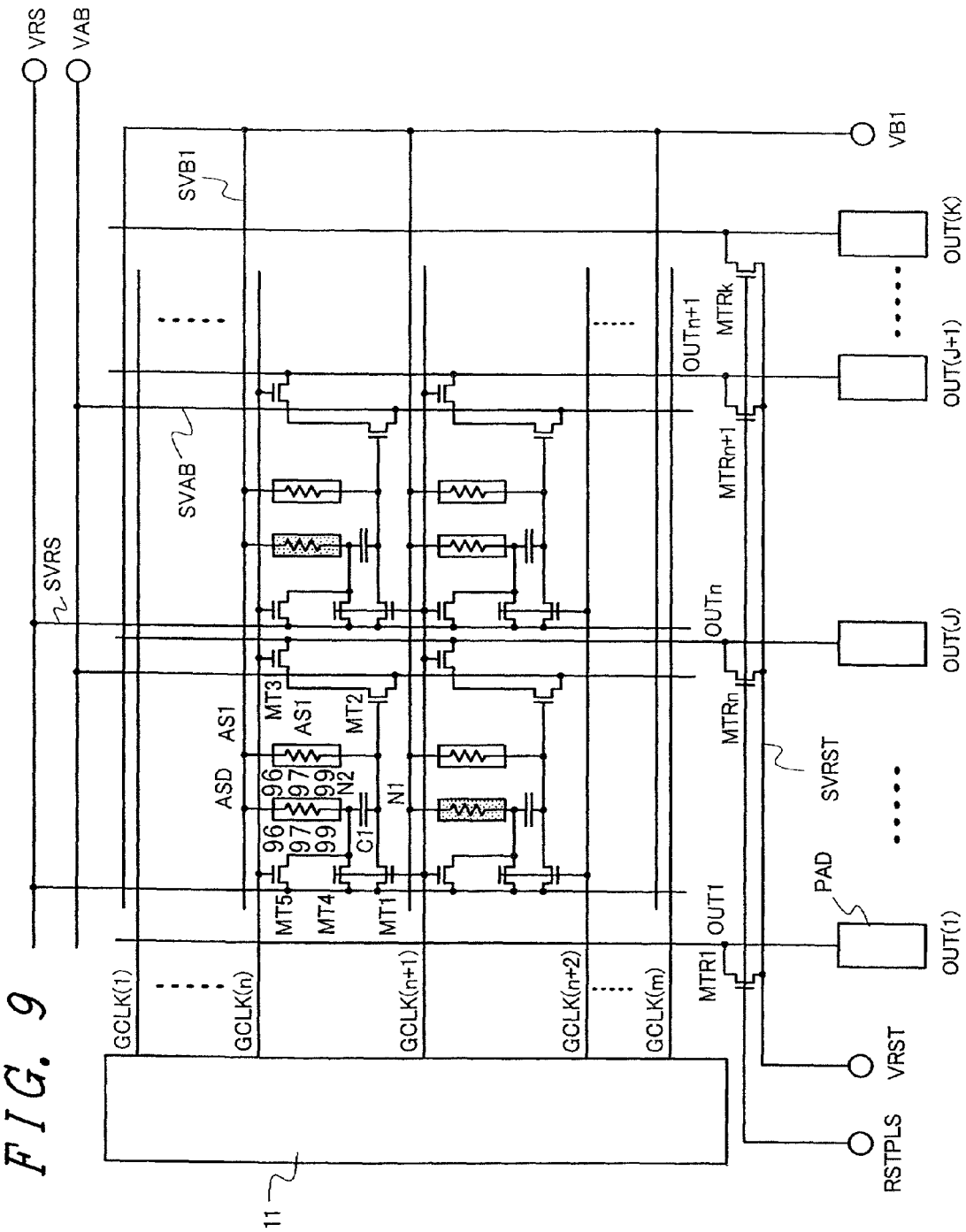
FIG. 9 is a circuit diagram showing the circuit constitution of the optical sensor array according to the modification of the embodiment of the present invention.

FIG. 9 is a circuit diagram showing the circuit constitution of the optical sensor array according to this modification.

The number of optical sensor pixels is m×K, and four pixels on a n-th row, an (n+1)th row, a J-th column and a (J+1)th column are shown in a specific circuit diagram. The circuit diagram of the optical sensor pixels is substantially equal to the circuit diagram shown in FIG. 8.

On a lower peripheral side of the optical sensor array, reset transistors MTR for resetting a voltage of the signal output line OUT, a reset line SVRST for supplying a reset voltage VRST and bonding pads PAD for outputting are arranged.

Figure 10:
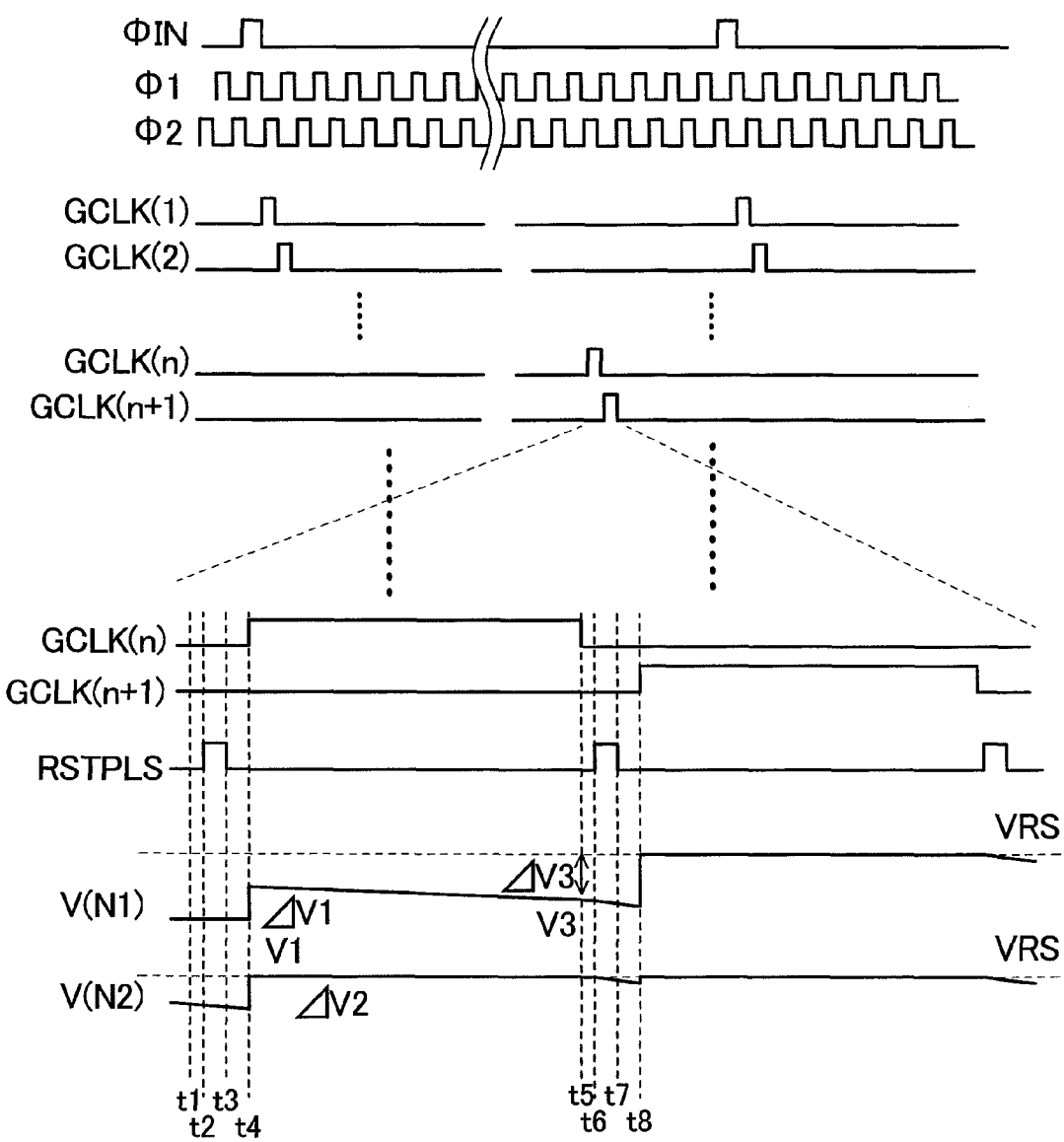
FIG. 10 is a timing chart for explaining an operation of the optical sensor array according to the modification of the embodiment of the present invention.
Figure 11A:
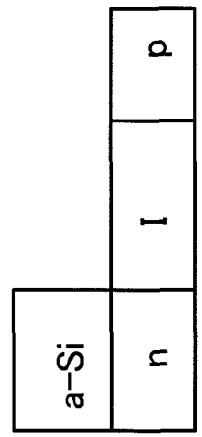
FIG. 11A to FIG. 11D are schematic views for explaining a conventional optical sensor circuit where a reverse bias is applied to a pn junction of a semiconductor and a depletion layer is used as a junction capacitance.
Figure 11B:
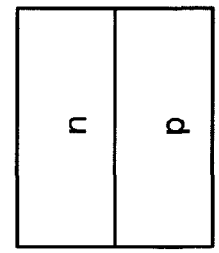
Figure 11C:
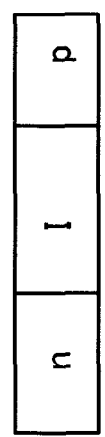
Figure 11D:
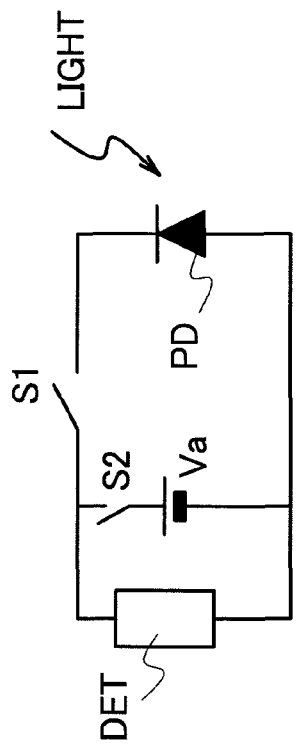

FIG. 10 is a timing chart for explaining an operation of the optical sensor array according to the modification of the embodiment. The manner of operation of the optical sensor pixel in the portion A shown in FIG. 8 is explained hereinafter in conjunction with FIG. 10.

For the sake of brevity, the respective bias voltages are set such that VB1=0V(GND), VAB=10V, while the reset voltages are set such that VRS=5V, VRST=0V. Further, threshold voltages Vth of the respective transistors (MT1 to MT5) are set to 1V for the sake of brevity. Further, voltages of respective clocks ($\phi 1$, $\phi 2$) are set such that a High level (hereinafter referred to as H level) is 10V and a Low level (hereinafter referred to as L level) is 0V.

In the same manner as FIG. 6, also in this modification, it is assumed that the respective optical sensor pixel rows are sequentially scanned from the top to the bottom on a surface of the drawing. That is, also in this modification, it is assumed that an ON voltage pulse is applied to the gate lines GCLK from the small-number row to the large-number row. Further, the explanation is made hereinafter by setting the gate lines GCLK such that GCLKn=GCLK1 and GCLK(n+1)=GCLK2.

Firstly, the operation is considered from a point of time that a voltage of 10V at an H level is supplied to the gate line GCLK2 by the shift register 11.

When the voltage of 10V at an H level is supplied to the gate line GCLK2, the transistor MT1 and the transistor MT4 assume an ON state, and an internal node N1 and internal node N2 arranged at both ends of the capacitive element C1 are electrically connected with the reset line SVRS and hence, the voltage at the internal node N1 and the voltage at the internal node N2 assume 5V which is the same potential as the reset voltage VRS.

When the voltage supplied to the gate line GCLK2 assumes the voltage of 0 at an L level, although the internal node N1 and the internal node N2 become electrically isolated nodes, the internal node N1 is connected to a bias line SVB1 via the light dependent variable resistance element AS1, and the internal node N2 is connected to the bias line SBV1 via the light dependent variable resistance element ASD for dark current compensation which is shielded from light.

When light is radiated to the photo sensor array, an electric current due to the resistance which differs from the resistance in a dark state flows in the internal node N1 attributed to a charge generated in the light dependent variable resistance element AS1 depending on incident light and temperature. Further, an electric current which is generated attributed to a charge generated attributed to temperature in the light dependent variable resistance element ASD for dark current compensation which is shielded from light, that is, a so-called dark current flows in the internal node N2.

A period during which the voltage supplied to the gate line GCLK2 assumes the voltage of 0V at an L level by the shift register 11, scanning of gate lines by the shift register 11 completes approximately one cycle (one frame), and the voltage of 10V at an H level is supplied to the gate line GCLK1 is a storage time of the optical signal due to the incident light.

When a control voltage RSTPLS assumes, for example, the voltage of 10V at an H level at a point of time t2, the reset transistor MTR shown in FIG. 9 assumes an ON state so that the signal output line OUT1 is reset to the reset voltage VRST of 0V.

When the control voltage RSTPLS assumes the voltage of 0V at an L level at a point of time t3, the signal output line OUT1 assumes a floating state.

When the voltage supplied to the gate line GCLK1 assumes the voltage of 10V at an H level at a point of time t4, the transistor MT3 and the transistor MT5 assumes an ON state. When the transistor MT5 assumes an ON state, the internal node N2 and the reset line SVRS are electrically connected with each other and hence, the voltage at the internal node N2 is reset to 5V which is the same potential as the reset voltage VRS.

When the voltage of the internal node N2 immediately before the point of time t4 is Vdark due to a dark current of the light dependent variable resistance element ASD for dark current compensation which is shielded from light, the voltage at the internal node N2 is changed by $\Delta V2$ (=VRS−Vdark).

This change brings about a change of the voltage at the internal node N1 via the capacitive element C1, wherein a voltage change $\Delta V1$ of the internal node N1 is approximately expressed by a following formula (1).

$$\Delta V1 = \Delta V2 \times C1/(C1+CS2+CS3) \quad (1)$$

Here, CS2, CS3 indicate all capacitances other than the capacitance C1 which the internal node N1 holds and the capacitances mainly include a gate-source capacitance of the transistor MT1 and a gate-source capacitance of the transistor MT2. From this formula (1), when the relationship of C1>>(CS2+CS3) is satisfied, $\Delta V1=\Delta V2$ is established.

Further, when the transistor MT3 assumes an ON state, the output line OUT1 and the bias line SVAB are connected with each other via the transistor MT2 and the transistor MT3.

Although the gate voltage of the transistor MT3 is 10V and is in a non-saturated operation, a gate of the transistor MT2 constitutes the internal node N1 so that the voltage of the gate becomes 5V or below corresponding to the incidence light quantity as described above and hence, the gate of the transistor MT2 is in a saturated state.

To assume the voltage at the internal node N1 immediately before the point of time t4 as V1, the voltage at the internal node N1 eventually becomes the voltage which is expressed by a following formula (2).

$$V3 \approx V1 + \Delta V1 \quad (2)$$

Using this voltage as the gate voltage, the voltage of the signal output line OUT1 is elevated to the voltage VOUT at which the transistor MT2 is turned off.

The voltage VOUT is approximately expressed by a following formula (3).

$$VOUT \approx V3 - Vth \quad (3)$$

Here, Vth is a threshold voltage of the transistor MT2.

The voltage obtained by the above-mentioned formula (3) is the output voltage of the optical sensor pixel from which a dark current component is substantially subtracted.

When the voltage of 0V at an L level is supplied to the gate line GCLK1 at a point of time t5, the transistor MT3 and the transistor MT5 assume an OFF state.

When the voltage of 10V at an H level is supplied to the gate line GCLK2 at a point of time t8, the transistor MT1 and the transistor MT4 assume an ON state so that the internal node N1 and the internal node N2 are reset to the reset voltage VRS of 5V.

The above-mentioned operation is repeated for respective pixels.

As has been explained heretofore, according to this modification, the dark current component is substantially subtracted at a stage where the output voltage is outputted from the optical sensor pixel and hence, it is unnecessary to compensate for the dark current outside whereby it is possible to use the optical sensor array as the optical sensor even in an environment where a dark state cannot be realized.

In the explanation made heretofore, the respective transistor (MT1 to MT5) are formed of the thin film transistor which uses polysilicon as a material of the semiconductor layer. Further, the respective transistors (MT1 to MT5) are formed of an n-type thin film transistor. However, the respective transistors (MT1 to MT5) may be formed of a p-type thin film transistor in place of the n-type thin film transistor.

It is needless to say that when the respective transistors (MT1 to MT5) are formed of the p-type thin film transistor, voltage values of the respective bias voltages are suitably changed.

Although the inventions made by inventors of the present invention have been specifically explained in conjunction with the embodiments, it is needless to say that the present invention is not limited to the above-mentioned embodiment and various modifications and variations are conceivable without departing from the gist of the present invention.

What is claimed is:

1. An optical sensor circuit comprising:
    an optical sensor element having an upper electrode to which a first reference voltage is inputted, a lower electrode which is formed of a metal film, and a light dependent variable resistance element which is sandwiched between the upper electrode and the lower electrode:
    a capacitive element which is connected between the lower electrode and a second reference voltage line which supplies a second reference voltage;
    a switch circuit which inputs a first power source voltage to the lower electrode in an ON state, and brings the lower electrode into a floating state in an OFF state; and
    a detection circuit which detects a voltage change of the lower electrode after light is radiated to the light dependent variable resistance element for a predetermined period with the lower electrode in a floating state, wherein
    the light dependent variable resistance element is formed of an amorphous silicon film, and
    the first reference voltage is a forward voltage in a current-voltage characteristic of a Schottky diode which is formed by the lower electrode and the amorphous silicon film which constitutes the light dependent variable resistance element.

2. The optical sensor circuit according to claim 1, wherein the first reference voltage and the second reference voltage have the same voltage.

3. The optical sensor circuit according to claim 1, wherein the switch circuit and the detection circuit are constituted of a thin film transistor which uses a polysilicon layer as a semiconductor layer.

4. An optical sensor circuit comprising:
    a first optical sensor element having a first upper electrode to which a first reference voltage is inputted, a first lower electrode which is formed of a metal film, and a first light dependent variable resistance element which is sandwiched between the first upper electrode and the first lower electrode:
    a second optical sensor element for dark current compensation having a second upper electrode to which the first reference voltage is inputted, a second lower electrode, and a second light dependent variable resistance element which is sandwiched between the second upper electrode and the second lower electrode:
    a capacitive element which is connected between the first lower electrode and the second lower electrode;
    a first switch circuit which inputs a first power source voltage to the first lower electrode in an ON state, and brings the first lower electrode into a floating state in an OFF state;
    a second switch circuit which inputs a first power source voltage to the second lower electrode in an ON state, and brings the second lower electrode into a floating state in an OFF state;
    a third switch circuit which inputs the first power source voltage to the second lower electrode after a lapse of a predetermined period in a state where the second lower electrode is in a floating state; and
    a detection circuit which detects a voltage change of the first lower electrode when the third switch circuit is in an ON state after light is radiated to the first light dependent variable resistance element for a predetermined period with the first lower electrode in a floating state, wherein
    the first light dependent variable resistance element is formed of an amorphous silicon film,
    the second light dependent variable resistance element is formed of an amorphous silicon film which is shielded from light,
    and
    the first reference voltage is a forward voltage in a current-voltage characteristic of a diode which is constituted of the first lower electrode and the amorphous silicon film which constitutes the first light dependent variable resistance element, and in a current-voltage characteristic of a diode which is constituted of the second lower electrode and the amorphous silicon film which constitutes the second light dependent variable resistance element.

5. The optical sensor circuit according to claim 4, wherein the respective switch circuits and the detection circuit are constituted of a thin film transistor which uses a polysilicon layer as a semiconductor layer.

6. An optical sensor array comprising:
    optical sensor pixels arranged in a matrix array, each optical sensor pixel including an optical sensor element; and output lines, wherein
    each optical sensor element includes an upper electrode to which a first reference voltage is inputted, a lower electrode, and a light dependent variable resistance element which is sandwiched between the upper electrode and the lower electrode,
    said each optical sensor pixel includes:
    a capacitive element which is connected between the lower electrode and a second reference voltage line which supplies a second reference voltage;
    a first transistor, including a first electrode, a second electrode, and a control electrode, configured for allowing a first power source voltage to be inputted to the second electrode thereof, allowing the first electrode thereof to be connected to the lower electrode of the optical sensor element, and allowing a second clock to be inputted to the control electrode thereof;
    a second transistor, including a first electrode, a second electrode, and a control electrode, configured for allowing a second power source voltage to be inputted to the second electrode thereof, and allowing the control electrode thereof to be connected to the lower electrode of the optical sensor element; and
    a third transistor, including a first electrode, a second electrode, and a control electrode, configured for allowing the second electrode thereof to be connected to the first electrode of the second transistor, allowing the first electrode thereof to be connected to the output line, and allowing a first clock to be inputted to the control electrode thereof, wherein
    the light dependent variable resistance element is formed of an amorphous silicon film.

7. The optical sensor array according to claim 6, further comprising:
    a first reference voltage line which supplies the first reference voltage;
    a second reference voltage line which supplies the second reference voltage;
    a first power source voltage line which supplies the first power source voltage;
    a second power source voltage line which supplies the second power source voltage;

a first clock line through which the first clock is inputted; and a second clock line through which the second clock is inputted.

8. The optical sensor array according to claim 6, wherein the first clock and the second clock have different phases.

9. The optical sensor array according to claim 6, wherein the first transistor inputs the first power source voltage to the lower electrode when the first transistor is turned on in response to the second clock and, subsequently, brings the lower electrode into a floating state during a period before the second clock is inputted.

10. The optical sensor array according to claim 9, wherein the third transistor is turned on in response to a first clock inputted prior to the second clock,
  the output line is set to the first reference voltage before the third transistor is turned on, and
  a voltage change of the lower electrode after light is radiated to the light dependent variable resistance element for a predetermined period with the lower electrode in a floating state is detected as a voltage change of the output line by the second transistor and the third transistor.

11. The optical sensor array according to claim 6, wherein the first reference voltage and the second reference voltage have the same voltage.

12. An optical sensor array comprising:
  optical sensor pixels arranged in a matrix array, each optical sensor pixel including a first optical sensor element and a second optical sensor element for dark current compensation; and
  output lines, wherein
  the first optical sensor element includes a first upper electrode to which a first reference voltage is inputted, a first lower electrode, and a first light dependent variable resistance element which is sandwiched between the first upper electrode and the first lower electrode,
  the second optical sensor element includes a second upper electrode to which a first reference voltage is inputted, a second lower electrode, and a second light dependent variable resistance element which is sandwiched between the second upper electrode and the second lower electrode,
  said each optical sensor pixel includes:
  a capacitive element which is connected between the first lower electrode and a second lower electrode;
  a first transistor, including a first electrode, a second electrode, and a control electrode, configured for allowing a first power source voltage to be inputted to the second electrode thereof, allowing the first electrode thereof to be connected to the first lower electrode of the first optical sensor element, and allowing a second clock to be inputted to the control electrode thereof;
  a second transistor, including a first electrode, a second electrode, and a control electrode, configured for allowing a second power source voltage to be inputted to the second the second electrode thereof, and allowing the control electrode thereof to be connected to the first lower electrode of the first optical sensor element;
  a third transistor, including a first electrode, a second electrode, and a control electrode, configured for allowing the second electrode thereof to be connected to the first electrode of the second transistor, allowing the first electrode thereof to be connected to the output line, and allowing a first clock to be inputted to the control electrode thereof, a fourth transistor, configured a first electrode, a second electrode, and a control electrode, configured for allowing a first power source voltage to be inputted to the second electrode thereof, allowing the first electrode thereof to be connected to the second lower electrode of the second optical sensor element, and allowing a second clock to be inputted to the control electrode thereof, and
  a fifth transistor, including a first electrode, a second electrode, and a control electrode, configured for allowing a second power source voltage to be inputted to the second electrode thereof, allowing a first electrode thereof to be connected to the second lower electrode of the second optical sensor element, and allowing a first clock to be inputted to the control electrode thereof, wherein
  the first light dependent variable resistance element is formed of an amorphous silicon film, and
  the second light dependent variable resistance element is formed of an amorphous silicon film which is shielded from light.

13. The optical sensor array according to claim 12, further comprising:
  a first reference voltage line which supplies the first reference voltage;
  a first power source voltage line which supplies the first power source voltage;
  a second power source voltage line which supplies the second power source voltage;
  a first clock line through which the first clock is inputted; and
  a second clock line through which the second clock is inputted.

14. The optical sensor array according to claim 12, wherein the first clock and the second clock have different phases.

15. The optical sensor array according to claim 12 wherein the first transistor inputs the first power source voltage to the first lower electrode when the first transistor is turned on in response to the second clock and, subsequently, brings the first lower electrode into a floating state during a period before the second clock is inputted, and
  the fourth transistor inputs the first power source voltage to the second lower electrode when the fourth transistor is turned on in response to the second clock and, subsequently, brings the second lower electrode into a floating state during a period before the second clock is inputted.

16. The optical sensor array according to claim 15, wherein the fifth transistor inputs the first power source voltage to the second lower electrode when the fifth transistor is turned on in response to the first clock inputted prior to the second clock.

17. The optical sensor array according to claim 16, wherein the third transistor is turned on in response to the first clock inputted prior to the second clock,
  the output line is set to the first reference voltage before the third transistor is turned on, and
  a voltage change of the lower electrode after light is radiated to the light dependent variable resistance element for a predetermined period with the first lower electrode in a floating state is detected as a voltage change of the output line by the second transistor and the third transistor.

18. The optical sensor array according to claim 12, wherein each transistor is constituted of a thin film transistor which uses a polysilicon layer as a semiconductor layer.

* * * * *